(12) United States Patent
Mizuno

(10) Patent No.: US 6,853,679 B1
(45) Date of Patent: Feb. 8, 2005

(54) INTERCONNECT CIRCUIT FOR DATA TRANSMISSION IN AN INTEGRATED CIRCUIT

(75) Inventor: Masayuki Mizuno, Kobe (JP)

(73) Assignees: The Board of Trustees of the Leland Stanford Junior University, Palo Alto, CA (US); NEC Corporation, Tokyo (JP)

( * ) Notice: Subject to any disclaimer, the term of this patent is extended or adjusted under 35 U.S.C. 154(b) by 737 days.

(21) Appl. No.: 09/653,070

(22) Filed: Aug. 31, 2000

(51) Int. Cl.[7] .................. H04B 17/02; H04B 3/36; H04B 7/17; H04L 25/20; H04L 25/52
(52) U.S. Cl. ..................... 375/212; 709/235
(58) Field of Search ............... 370/231, 235; 709/202; 710/29; 348/14.02; 712/18; 713/1; 379/1.03; 725/17; 375/212

(56) References Cited

U.S. PATENT DOCUMENTS

| | | | | |
|---|---|---|---|---|
| 5,457,687 A | * | 10/1995 | Newman | 370/232 |
| 5,845,072 A | * | 12/1998 | Finney et al. | 709/208 |
| 5,907,485 A | * | 5/1999 | Van Loo et al. | 700/3 |
| 5,914,887 A | * | 6/1999 | Scepanovic et al. | 716/8 |
| 5,958,030 A | * | 9/1999 | Kwa | 710/300 |
| 5,963,975 A | * | 10/1999 | Boyle et al. | 711/147 |
| 6,016,063 A | * | 1/2000 | Trimberger | 326/81 |
| 6,438,107 B1 | * | 8/2002 | Somiya et al. | 370/233 |

\* cited by examiner

*Primary Examiner*—Stephen Chin
*Assistant Examiner*—Harry Vartanian
(74) *Attorney, Agent, or Firm*—Sughrue Mion, PLLC

(57) ABSTRACT

An interconnect circuit transmits data signals from a first terminal to a second terminal through a data line having a plurality of data driving circuits capable of temporarily interrupting or reestablishing data transmission in a portion of the data line responsive to congestion signals which propagate along a congestion line in a direction opposite the direction of data signal transmission. The congestion signals may be indicative of the status of the second terminal, where a first congestion signal may indicate the second terminal is not receiving data and a second congestion signal may indicate the second terminal is receiving data. Different types of data driving circuits may be cascade-connected in an alternating fashion and may be adapted to interrupt or to reestablish data transmission in sequence starting from the data driving circuit nearest the second terminal of the interconnect and continuing in the direction of the first terminal. The speed with which the first congestion signal and the speed with which the second congestion signal propagate along the congestion line may or may not be equal.

30 Claims, 11 Drawing Sheets

INTERCONNECT CIRCUIT FOR DATA TRANSMISSION IN AN INTEGRATED CIRCUIT

BACKGROUND OF THE INVENTION

1. Field of the Invention

The present invention is related generally to a long interconnect between elements of an integrated circuit, and more particularly to an interconnect circuit capable of interrupting data transmission in a long interconnect responsive to congestion conditions.

2. Description of the Related Art

Due to recent advancements in large-scale integrated (LSI) circuit design and manufacturing technologies, the interconnect wires commonly used to connect LSI circuit elements have been steadily decreasing in size; currently, interconnect wires are as thin as about 0.2 microns ($\mu$m). In such a micro-wire, the wiring resistance may become as large as 300 ohms/mm, which creates difficulties with respect to high-speed transmission of data signals in the wire.

Such a high value of wiring resistance can be problematic, in particular, with respect to large-scale LSIs produced in recent years, in which the chip area has become large and the proportion of the connections on the chip requiring long interconnect wires, for example exceeding 10 mm in length, has increased.

For example, if wiring resistance, wiring capacity, output resistance of a driving circuit to activate the wire, and input capacity of the circuitry located at the output end, or "downstream" end, of the interconnect wire are assigned the symbols R1, C1, Rs, and C, respectively, the input/output delay time, or "latency," of this interconnect wire is given by the formula:

$$Rs*(C1+C)+R1*(C1/2+C)$$

Given a long interconnect wire of 0 mm in length having typical values (for example, R1=3,000 ohms, C1=2,000 fF, Rs=370 ohms, and C=28 fF) for use in the next generation of LSIs (for example, a 0.1 $\mu$m-generation CMOS device), the latency of this 10 mm wire is about 3.8 ns.

Since the operational frequency of an LSI of this 0.1 $\mu$m-generation CMOS construction will generally exceed 1 GHz, this latency of 3.8 ns is quite a large value relative to the operational frequency.

In order to reduce on-chip interconnect latency caused by wiring resistance, it is common to insert repeaters (in the form of inverters or buffer amplifiers) at spaced intervals along an interconnect wire. Even with such inserted repeaters, however, interconnect latency increases with LSI process scaling, and this latency invariably degrades the performance of sophisticated LSIs.

Problems associated with interconnect latency can be greatly aggravated when the downstream end of a long interconnect is not capable of receiving data at the same rate at which the input end, or "upstream" end, of the interconnect is transmitting data. In present systems widely in use, when the downstream end of a long interconnect, due to congestion, for example, refuses to receive data signals which have been transmitted through the interconnect wire, a notice of this refusal is sent to the upstream end of the long interconnect. Thereupon, data input at the upstream end of the interconnect is temporarily interrupted. However, data in transit along the length of the interconnect may be lost; when the downstream end is not able to receive, it becomes necessary either to discard data within the interconnect, or to store that data temporarily until the downstream end is capable of resuming data reception. Such a data storage function is typically performed by one or more high capacity data buffers prepared separately at or near the downstream end of the long interconnect.

Also, when such a signal refusing data reception is delayed considerably in reaching the upstream end of the long interconnect (due to latency associated with the interconnect, for example), some data signals are transmitted during the latency period from the upstream end through the long interconnect uselessly; that is, the data signals, though transmitted from the upstream end, will never be received at the downstream end. In this situation, it becomes necessary to increase the capacity of the data buffers prepared at the downstream end of the long interconnect so that these data signals will not be lost; providing a long interconnect with high capacity data buffers is both expensive and inefficient.

Further, in conventional applications, since no valid data signals exist along the length of the long interconnect when the downstream end resumes data reception, there can be a significant delay (for example, as great as the latency of the entire long interconnect) for the first data signals to reach the downstream end after the resumption of data reception; such delays can produce a significant degradation in data transmission rates and overall throughput of the interconnect.

Consequently, simply adding inverters or buffer amplifiers at spaced intervals along the length of the interconnect, while reducing latency and increasing data throughput during the periods in which transmitted data signals are actually accepted at the downstream end, is not an adequate solution to the problems associated with data congestion in the interconnect.

Therefore, in creating the next generation high-performance large-scale LSIs, it is desirable to reduce the latency of a long interconnect while simultaneously addressing the problem of lost data which can occur due to congestion.

SUMMARY OF THE INVENTION

The present invention addresses the above-mentioned and other shortcomings of conventional approaches by providing a long interconnect having a data circuit and a congestion circuit. In the data circuit, short lengths of data wire may each have an associated data driving circuit; the congestion circuit may be cascade-connected to the data circuit such that congestion signals indicative of the status of the downstream end of the interconnect may be transmitted to each data driving circuit. In accordance with the present invention, the effect on the latency of a long interconnect which is caused by wiring resistance may be substantially reduced; as a result, data transmission throughput is increased. In addition, communicating the status of the downstream end of the interconnect to the data driving circuits, each of which may operate as a buffer to store a data signal temporarily, prevents unnecessary data loss due to temporary suspension of data transmission.

As discussed above, in order to reduce the influence of wiring resistance on the overall latency of a long interconnect, a long interconnect wire may be divided into multiple short wires, and driving circuits (including repeaters or buffer amplifiers) may be inserted between the short segments of wire. In other words, a long interconnect wire may be divided into a predetermined number, n, of short data wires; a separate data driving circuit may be employed to activate each data wire. In accordance with one embodiment of the present invention utilizing this arrangement, n number of these units (composed of a data wire and an associated data driving circuit to activate it) combine to form a data circuit, or data line, spanning the length of the interconnect; the data line may be cascade-connected with an associated congestion circuit, or congestion line, of the same general construction. Data signals may be transmitted sequentially through the data wires making up the data line responsive to signals received from the congestion line.

As a result of this interconnect circuit arrangement, data transmission in a long interconnect is not only fast but also very reliable. For example, where the 10 mm wire used in the example above is divided into 20 short segments of data wire, and 20 data driving circuits are inserted between the data wires, the latency of the resulting data line is given by the formula:

$$20*[Rs*(C1/20+C)+R1/20*(C1/2/20+C)]$$

Using the same values as given above for all the variables, the value of the latency for the same 10 mm length of interconnect can be reduced to about 1.2 ns.

Additionally, use of a plurality of data driving circuits as described above means that multiple data signals can exist simultaneously in the long interconnect. If the cycle of data entering at the upstream end of the long interconnect is 100 ps, and the latency of the long interconnect is about 1.2 ns, as noted above, there can exist, theoretically, 12 data signals in the length of the interconnect at all times. The cycle of the data entered into data wires, however, must be longer than the delay time between the data driving circuits. If the 20 data driving circuits of the above example are inserted along the length of the interconnect, the delay time between each of the data driving circuits is given by the formula:

$$Rs*(C1/20+C)+R1/20*(C1/2/20+C)$$

This value is about 59 ps.

As a result of the fact that multiple data signals can exist along the length of the interconnect, throughput of the data transmitted through the data line of the interconnect can be improved. In the above example, the throughput value, since it is a function of the inverse of the delay time between data driving circuits, reaches a theoretical maximum of 16 Gbps. This value is in contrast to the example of the long interconnect which is not divided into segments; in that case, the throughput value reaches only 0.26 Gbps.

In accordance with the interconnect circuit of the present invention employing a congestion line in association with a data line, it is possible to preserve the data signals existing along the length of the interconnect when the downstream end refuses data reception. Consequently, the interconnect circuit of the present invention substantially eliminates the need to prepare a high capacity data buffer at or near the downstream end of the interconnect for temporary storage of these data signals; where use of a data buffer is desired, the present invention allows data buffers of significantly reduced capacity.

Also, the interconnect circuit of the present invention prevents unnecessary loss of data signals which are transmitted from the upstream end through the long interconnect during the latency period after the downstream end transmits a refusal to receive data signal. In other words, even in the case where the delay time for the signal refusing data reception to reach the upstream end is considerable, the present invention makes it unnecessary to prepare a high capacity buffer at the downstream end of the long interconnect for the temporary storage of the data signals transmitted after the refusal signal is transmitted by the downstream end but before that signal is received at the upstream end.

The interconnect circuit of the present invention may be characterized generally as follows.

In one embodiment, an interconnect circuit transmits data signals from a first terminal downstream to a second terminal using a data line of short data wires each having an associated data driving circuit capable of temporarily interrupting and reestablishing data transmission in its associated data wire; the data driving circuits may alternate sequentially between a first type of driving circuit and a second type of driving circuit, and may be responsive to signals from a congestion line. The congestion line of short congestion wires, each having an associated secondary driving circuit, transmits congestion signals from a third terminal to a fourth terminal in a direction opposite the direction of data signal transmission (i.e. upstream); the congestion signals may be indicative of the status of the second terminal.

In accordance with this embodiment, the interconnect circuit selectively activates and de-activates the output terminals of the data driving circuits so as to interrupt and to reestablish data transmission at each data driving circuit in sequence starting from the downstream end of the interconnect and continuing upstream; the congestion signal which causes interruption of data transmission and the congestion signal which causes reestablishment of data transmission both may propagate upstream along the congestion line at the same speed to all the secondary driving circuits in sequence.

In accordance with another embodiment having the same general constitution as described above, an interconnect circuit again transmits data signals from a first terminal downstream to a second terminal in accordance with the status of the second terminal; in this embodiment, however, the congestion signal which causes interruption of data transmission may propagate upstream more slowly along the congestion line from the secondary driving circuit nearest the downstream end to all the secondary driving circuits in sequence. The speed at which the congestion signal interrupting data transmission propagates upstream along the congestion line may be reduced as much as possible while still satisfying the condition that two or more consecutive data signals in the data line will not be entered into the same data driving circuit, the data transmission activity of which is temporarily suspended.

Each data driving circuit may be capable of acting as a data buffer during periods when data signals are not transmitted. Additionally, each data driving circuit may have a congestion input terminal through which signals from the congestion line indicative of the status of the second terminal may be received. The appropriate congestion signals may be transmitted to the data driving circuits in the data line sequentially, starting from the second terminal end of the interconnect and continuing upstream. By way of example, the signals entered into the congestion input terminals of the data driving circuits in the data line may be called A(1), A(2), A(3), . . . , A(n), counting from the data driving circuit closest to the second terminal end of the interconnect. The output signals of the secondary driving circuits in the congestion line may be called B(1), B(2), B(3), . . . , B(n), counting from the secondary driving circuit closest to the third terminal (i.e. the downstream end of the interconnect). In such a case, A(1)=B(1), A(2)=B(2), A(3)=B(3), . . . , A(n)=B(n).

The speed with which the data driving circuits interrupt activation of their respective data wires, starting from the data driving circuit nearest to the second terminal end, and continuing upstream in the direction of the first terminal, and the speed with which the data driving circuits reactivate their respective data wires may be the same.

In an interconnect circuit arranged in accordance with this embodiment of the present invention, where the number of secondary driving circuits in the congestion line is k*m, and may be different from the number, n, of data driving circuits in the data line:

$$A(1)=A(2)=\ldots =A(k)=B(1), A(k+1)=A(k+2)=\ldots$$
$$A(2^*k)=B(2), \ldots A(k^*m-k+1)=A(k^*m-k+2)=\ldots =$$
$$A(k^*m)=B(n).$$

Also, when the time required to transmit a data signal from the first terminal to the second terminal is Td, the time required to transmit a congestion signal from the third terminal to the fourth terminal is Tb, the number of data driving circuits is n, the number of secondary driving circuits is m, and the minimum time required for entering a data signal into the first terminal of the data line is Ts, then the value of Tb/m may be made as large as possible, with the condition that Tb/m does not exceed the difference (Ts−Td/n). This limitation will ensure that two or more consecutive data signals will not enter a data driving circuit which has been deactivated according to signals received from the congestion line.

Additionally, the present invention encompasses interconnects which may include a plurality of parallel one-bit data lines, each of which may generally be constituted in the manner discussed above. In such an embodiment, each respective data line may be constituted by respective data wires, each in turn, having a respective data driving circuit connected in alternating fashion, i.e. alternating between a first type of driving circuit and a second type of driving circuit as discussed above.

Where such a plurality of data lines are prepared in parallel along the length of the interconnect, each data driving circuit may be numbered, for example, as a function of distance from the first terminal; by assigning a common signal coming off the congestion line for determining whether or not to activate the respective data wire for each data driving circuit bearing the same number, counting from the first terminal side, the bit length of the entire data message transmitted from the first terminal to the second terminal may be made to be greater than one bit.

Furthermore, in the above-described embodiments, an interconnect circuit in accordance with the present invention may be characterized by the fact that the various driving circuits may have arithmetical or logical functions.

The above-mentioned and other attendant advantages of the present invention will become more apparent upon examination of the following detailed description of the preferred embodiments thereof with reference to the attached drawings.

DETAILED DESCRIPTION OF THE PREFERRED EMBODIMENTS

Figure 1:
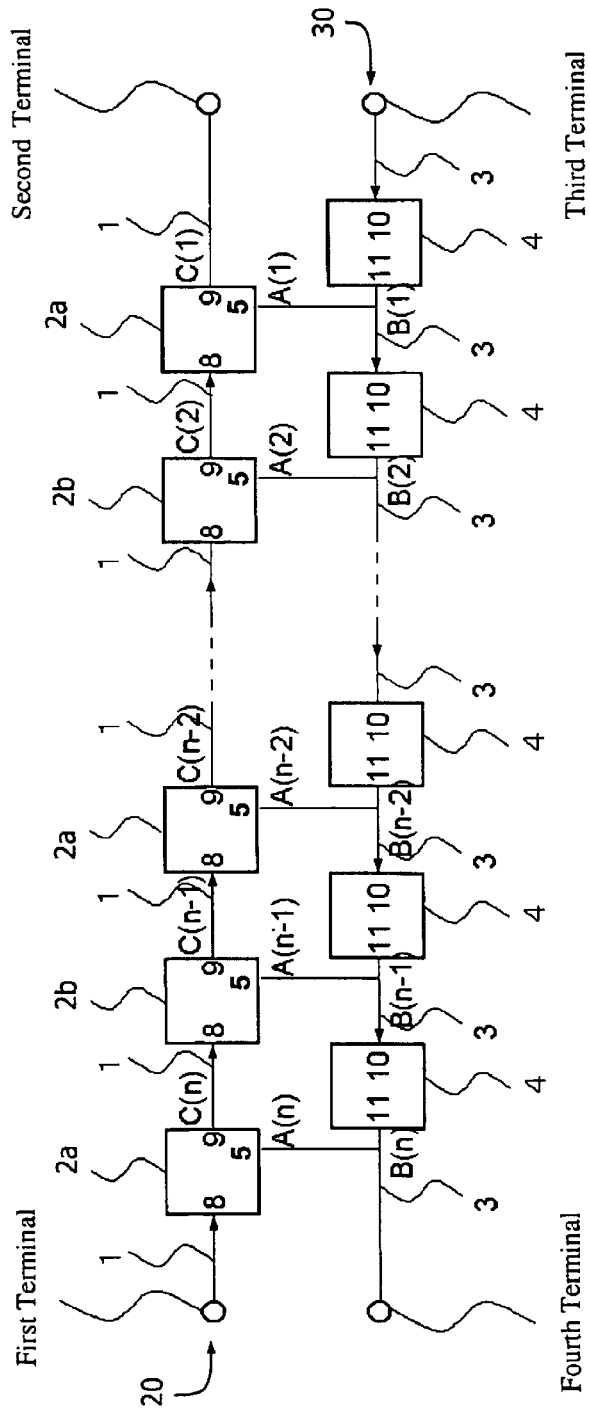
FIG. 1 is a schematic diagram of one embodiment of the interconnect circuit of the present invention.

Turning now to the drawings, FIG. 1 is a schematic diagram of one embodiment of an interconnect circuit of the present invention. In accordance with the present invention, an interconnect circuit is provided for transmitting data signals through a long interconnect from a first terminal to a second terminal; the direction of data transmission is from left to right in FIG. 1. A data circuit, or data line 20, may have a predetermined number, n, of data wires 1; data flow may be selectively interrupted and reestablished in each data wire 1 by an associated data driving circuit 2a or 2b; as will be discussed below, data driving circuit 2a and data driving circuit 2b may be of different general construction and may be arranged in alternating fashion. Each data driving circuit 2a and 2b may be capable of temporarily interrupting or reestablishing data transmission in each respective data wire 1. In this embodiment, n number of such units comprising a data wire 1 and a data driving circuit 2a or 2b may be cascade-connected to a congestion line 30 as illustrated in FIG. 1.

As will be described in detail below, both a congestion signal to interrupt data transmission and a congestion signal to reestablish data transmission may be transmitted from a third terminal to a fourth terminal through a predetermined number (which may or may not be equal to n) of congestion wires 3 of the congestion line 30; these congestion signals, indicative of the data reception status of the second terminal, may be propagated through each congestion wire 3 by an associated secondary driving circuit 4. Through the cascade-connection arrangement illustrated in FIG. 1, data driving circuits 2a and 2b may receive signals, through congestion input terminals 5, to interrupt or to reestablish transmission of data signals sequentially from the second terminal end, or "downstream" end, of the interconnect to the first terminal end, or "upstream" end.

In other words, when the second terminal of the interconnect refuses data reception, a congestion signal to interrupt data transmission temporarily may be transmitted from the third terminal to the fourth terminal; the direction in which such a congestion signal may be transmitted is from right to left in FIG. 1 (opposite the direction of data transmission).

That is, whereas data signals may be considered to propagate in a downstream direction from the first terminal end to the second terminal end of the interconnect, congestion signals may be considered to propagate upstream, from the second terminal end of the interconnect toward the first terminal end. When a congestion signal to interrupt data transmission reaches the fourth terminal at the upstream end of the interconnect, multiple data signals may be stored in the data line. At the same time, the upstream end of the interconnect, i.e. the first terminal, is now notified that the downstream end of the interconnect, i.e. the second terminal, has refused data reception.

In accordance with this embodiment, the multiple data signals existing along the length of the interconnect circuit at the time when the second terminal refuses data reception are not discarded, which is wasteful; rather, each data driving circuit 2a and 2b in FIG. 1 may be capable of performing as a data buffer, storing a data signal temporarily, i.e. during the period that data transmission is interrupted. As a result, it is not necessary to prepare a separate high capacity data buffer to store these data signals temporarily at or near the second terminal.

Even in the case where the signal refusing data reception takes a considerable amount of time to reach the upstream end of the interconnect, the first terminal does not transmit data signals into data line 20 wastefully during the delay time, since data signals may be successfully stored in data driving circuits 2a and 2b during this latency. It is not necessary, therefore, to provide a high capacity data buffer at or near the second terminal.

As noted above, a congestion signal indicative of the status of the second terminal may be transmitted to data driving circuits 2a and 2b sequentially from the downstream end of the interconnect in the direction of the first terminal. In one embodiment of the present invention, the speed with which the congestion signal to interrupt data transmission temporarily is transmitted may be equal to the speed with which the congestion signal to reestablish data transmission is transmitted; in this case, when the second terminal resumes data reception, the time necessary for data signals to reach the second terminal immediately following this resumption of data reception is not a function of the latency of the entire long interconnect. Also, data signals may be delivered to the second terminal at a rate equal to the rate with which they are transmitted from the first terminal; because data signals are temporarily stored in data driving circuits 2a and 2b along the length of the interconnect, this data transfer rate may be achieved immediately upon resumption of data reception at the second terminal.

In another embodiment of the present invention, the speed with which the congestion signal to interrupt data transmission propagates upstream may be slower than the speed with which the congestion signal to reestablish data transmission propagates upstream; the congestion signal to interrupt data transmission, though slowed, may still propagate fast enough such that two consecutive data signals input into data line 20 will not be entered into the same data driving circuit 2a or 2b whose data transmission activity is temporarily suspended. In this embodiment, the number of data signals which can be stored temporarily in data line 20 while the second terminal is refusing data reception can be increased.

Examining FIG. 1 more closely: A(1) through A(n) indicate the electric potential at the congestion input terminal 5 of each respective data driving circuit 2a and 2b; B(1) through B(n) indicate the electric potential at the output terminal 11 of each respective secondary driving circuit 4; C(1) through C(n) indicate the electric potential at the output of each data driving circuit 2a and 2b; numbers are assigned in order from the downstream end of the interconnect to the upstream end.

Figure 2:
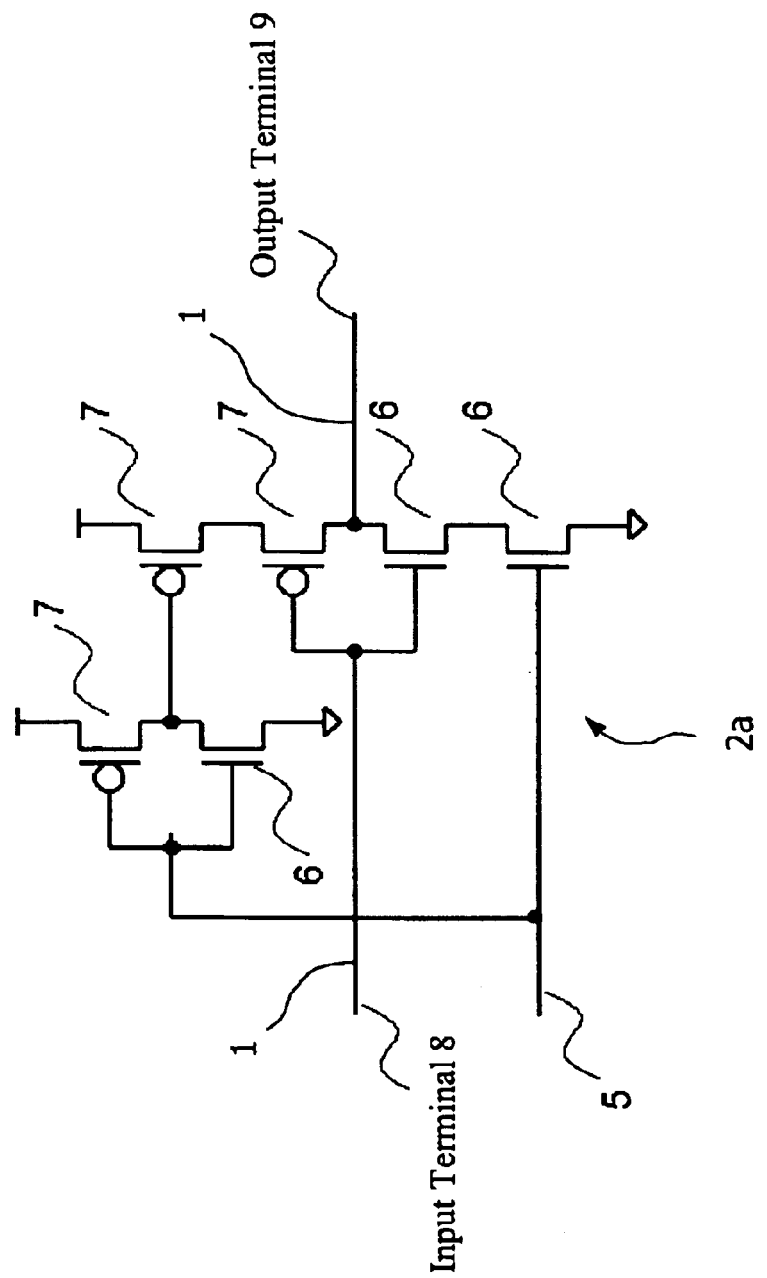
FIG. 2 is a schematic diagram of one embodiment of a data driving circuit for use in accordance with the present invention.
Figure 3:
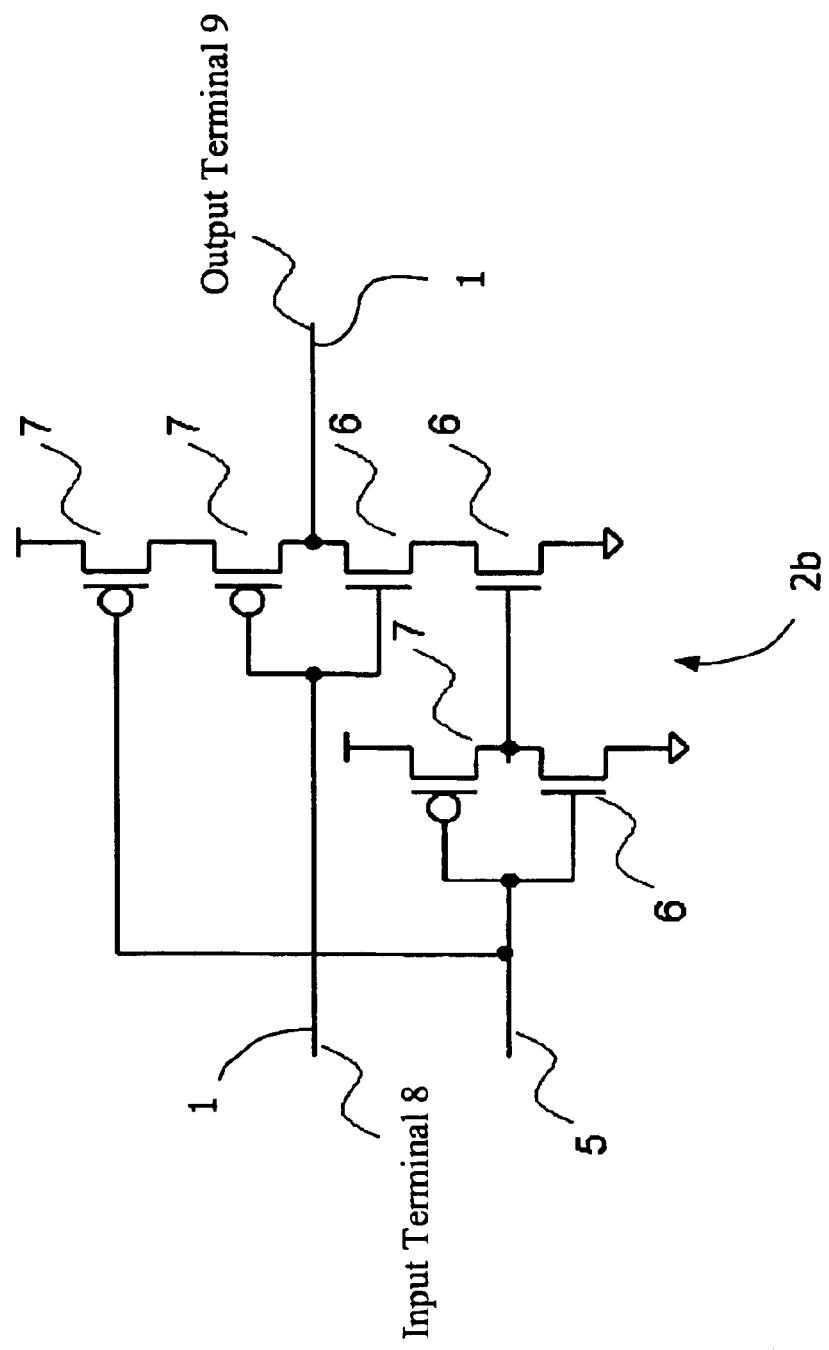
FIG. 3 is a schematic diagram of another embodiment of a data driving circuit for use in accordance with the present invention.
Figure 4:
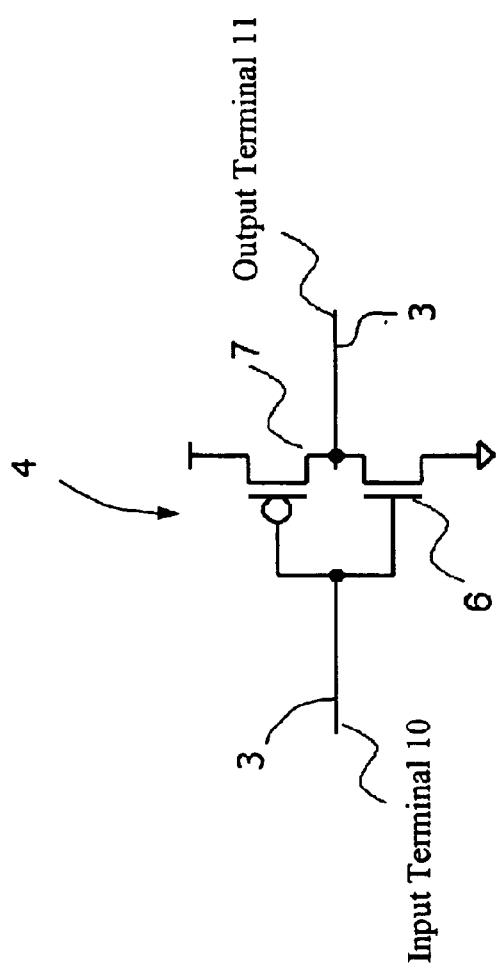
FIG. 4 is a schematic diagram of one embodiment of a secondary driving circuit for use in accordance with the present invention.

FIG. 2 is a schematic diagram of one embodiment of a data driving circuit 2a for use in accordance with the embodiment illustrated in FIG. 1. FIG. 3 is a schematic diagram of one embodiment of a data driving circuit 2b for use in accordance with the embodiment illustrated in FIG. 1. FIG. 4 is a schematic diagram of one embodiment of a secondary driving circuit 4 for use in accordance with the present invention.

In operation of the interconnect circuit, data signals may be input at the first terminal, transmitted through data line 20 comprising a plurality of data wires 1 each driven by a respective data driving circuit 2a or 2b, and output to the second terminal. The data driving circuit 2a or 2b closest to the first terminal receives data input through data wire 1 connected to its input terminal 8, and activates data wire 1 connected to its output terminal 9, which in turn, is connected to input terminal 8 of the next data driving circuit 2a or 2b, and so forth. In this manner, data signals are transmitted sequentially to each data driving circuit 2a and 2b between the first terminal and the second terminal. As described below, activation of the various data wires 1 may be selectively interrupted and reestablished by each data driving circuit 2a and 2b responsive to signals received at congestion input terminal 5.

One embodiment of a data driving circuit 2a is shown in detail in FIG. 2. Data wire 1 connected to output terminal 9 is activated when the level of electric potential at congestion input terminal 5 is high; conversely, data transmission is temporarily interrupted when the level of electric potential at congestion input terminal 5 is low. The data transmission and data buffer capabilities of data driving circuit 2a are enabled by the arrangement of the various NMOS transistors 6 and pMOS transistors 7 as shown. Another embodiment of a data driving circuit 2b, wherein the organization of transistors 6 and 7 is slightly modified, is shown in detail in FIG. 3. In this embodiment, data wire 1 connected to output terminal 9 is activated when the level of electric potential at congestion input terminal 5 is low; conversely, data transmission is interrupted temporarily when this level is high.

In the case where the embodiment shown in FIG. 4 is implemented as the secondary driving circuits 4 in FIG. 1, when the level of electric potential of the third terminal is low, the electric potential of the output terminal 11 of each secondary driving circuit 4, namely, B(1), B(2), . . . , B(n-2), B(n-1), B(n), will alternate high level, low level, high level, low level, and so on. Similarly, when the level of electric potential of the third terminal is high, the electric potential B(1), B(2), . . . , B(n-2), B(n-1), B(n), in FIG. 1 will alternate low level, high level, low level, high level, and so forth. This alternating electric potential is created by transistors 6 and 7 arranged in each secondary driving circuit 4.

As noted briefly above, the exemplary embodiment illustrated in FIG. 1 employs data driving circuits 2a and 2b connected in an alternating fashion; that is, one embodiment of data driving circuit 2a, as shown in FIG. 2, and another embodiment of data driving circuit 2b, as shown in FIG. 3, are alternately used in sequence starting from data driving circuit 2a closest to the second terminal. With such an arrangement cascade-connected to congestion line 30 employing secondary driving circuits 4 as illustrated, when the level of electric potential of the third terminal is low, data signals are transmitted in data line 20 from the first terminal to the second terminal, and, when the level of electric potential of the third terminal is high, data signals are not transmitted in data line 20.

By way of example, consider a case where the level of electric potential of the third terminal is changed from low to high. In such a case, this signal change propagates in the form of a congestion signal indicative of the second terminal's recent refusal to receive data. The congestion signal propagates upstream to each successive secondary drive circuit 4 from the third terminal to the fourth terminal; that is, the electric potential at output terminal 11 of each secondary drive circuit 4 will be affected in the order of B(1), B(2), . . . , B(n–2), B(n–1), B(n). As the congestion signal travels upstream, activation of data wires 1 is sequentially interrupted temporarily by data driving circuits 2a and 2b, starting at data driving circuit 2a closest to the second terminal end of data line 20.

Figure 5:
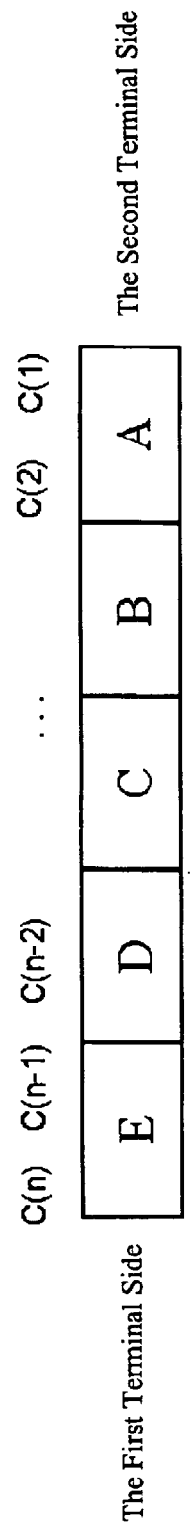
FIG. 5 is a representation of data signals existing in an interconnect circuit of the present invention immediately after the second terminal refuses to receive data.
Figure 6:
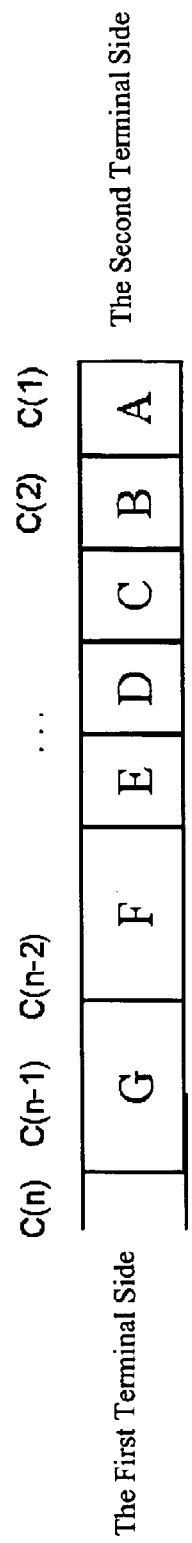
FIG. 6 is a representation of data signals existing in an interconnect circuit of the present invention when a congestion signal indicative of the second terminal's refusal to receive data has propagated half the distance of the interconnect.
Figure 7:
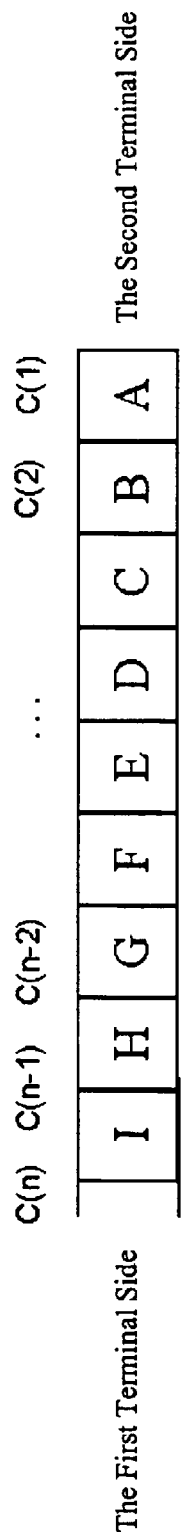
FIG. 7 is a representation of data signals existing in an interconnect circuit of the present invention when a congestion signal indicative of the second terminal's refusal to receive data has propagated across the entire interconnect.

FIG. 5 is a representation of the data signals existing at the output terminal 9 of each data driving circuit 2a and 2b, that is C(n), C(n–1), C(n–2), . . . , C(1), immediately after the level of electric potential of the third terminal is changed from low to high, i.e. generation of a congestion signal indicative of a refusal to receive data. FIG. 6 is a representation of the data signals existing at C(n), C(n–1), C(n–2), . . . , C(1) when the congestion signal indicative of the second terminal's refusal to receive data has propagated half the distance of the interconnection. FIG. 7 is a representation of the data signals existing at C(n), C(n–1), C(n–2), . . . , C(1), when the congestion signal indicative of the second terminal's refusal to receive data has propagated across the entire interconnect.

At the instant in time depicted in FIG. 5, five data signals, from A through E, are being transmitted in the long interconnect circuit of the present invention at the moment the second terminal refuses to receive data. FIG. 5 represents an exemplary case wherein the latency of the long interconnect is five times greater than the cycle of data signals transmitted from the first terminal.

In FIG. 6, since data driving circuits are gradually interrupting data transmission sequentially from the downstream end of the interconnect, fewer data driving circuits are outputting data signals. Also, since some time has elapsed as the congestion signal has propagated upstream from the third terminal, new data signals, F and G, have been input into the data line.

In FIG. 7, all of the data driving circuits in the data line have interrupted data transmission, i.e. no data signals are propagating. Also, since still more time has elapsed as the congestion signal has propagated all the way to the fourth terminal, new data signals H and I, in addition to data signals A through G, have been input into the data line from the first terminal end of the interconnect. At this point, however, the first terminal is apprised of the second terminal's refusal to receive data; as a result, no further data signals will be entered into the data line until a congestion signal indicative of the second terminal's resumption of data reception reaches the fourth terminal.

Next, consider the case where the second terminal is capable of receiving data signals; the third terminal's electric potential level may then be changed from high to low. In this case, a congestion signal indicative of a resumption of data reception at the second terminal is transmitted by the congestion line through the secondary driving circuits in sequence in the order of B(1), B(2), . . . , B(n–2), B(n–1), B(n). As the congestion signal announcing resumption of data reception travels upstream, data driving circuits sequentially reestablish data transmission, starting at the data driving circuit closest to the second terminal end of the interconnect circuit. While, as noted above, no new data signals will be input into the data line until the first terminal is apprised of the second terminal's status as receiving data, existing data signals are drained from the data line as the congestion signal propagates toward the upstream end of the interconnect.

Figure 8:
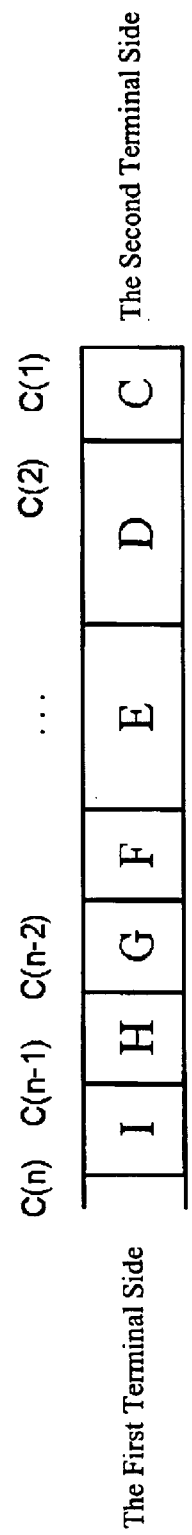
FIG. 8 is a representation of data signals existing in an interconnect circuit of the present invention when a congestion signal indicating the second terminal has resumed data reception has propagated half the distance of the interconnect.
Figure 9:
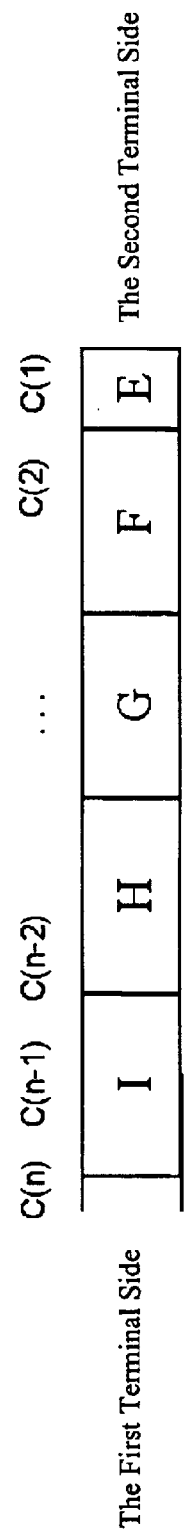
FIG. 9 is a representation of data signals existing in an interconnect circuit of the present invention when a congestion signal indicating that the second terminal has resumed data reception has propagated across the entire interconnect.

FIG. 8 is a representation of the data signals existing at C(n), C(n–1), C(n–2), . . . , C(1) when the congestion signal announcing resumption of data reception has propagated half the distance of the interconnect. FIG. 9 is a representation of the data signals existing at C(n), C(n–1), C(n–2), . . . , C(1), when the congestion signal announcing resumption of data reception has propagated across the entire interconnect.

In FIG. 8, since data driving circuits are reestablishing data transmission sequentially from the second terminal end of the interconnect, the number of data driving circuits outputting data signals is increasing. Also, since some time has elapsed as the congestion signal announcing resumption of data reception has propagated upstream from the third terminal (i.e. since the third terminal's electric potential level changed from high to low), data signals A and B have already been output to the second terminal; these data signals no longer exist in the data line.

As illustrated in FIG. 7, when the congestion signal indicative of a refusal to receive data, initially transmitted from the third terminal, has reached the fourth terminal, multiple data signals, more numerous than the ones in FIG. 5, may be stored in compressed form in the data line between the first terminal and the second terminal.

As illustrated in FIGS. 8 and 9, when the congestion signal indicative of a resumption of data reception propagates along the congestion line from the third terminal upstream toward the fourth terminal through the secondary driving circuits, a signal propagates to the data driving circuits through each respective congestion input terminal; this propagation sequentially reestablishes data transmission in the data wires. As a result, the above-noted data signals, compressed in the data line, are gradually decompressed and output to the second terminal.

In other words, multiple data signals that exist inside the interconnect circuit when the second terminal refuses data reception, i.e. when the third terminal's electric potential level is changed from low to high, are automatically stored in the interconnect circuit in compressed form and not unnecessarily discarded; rather, these data signals may be stored temporarily in the data driving circuits until the second terminal is prepared to receive data again. Also, it is unnecessary to prepare a high capacity data buffer near the second terminal for storing these data signals temporarily while the second terminal is refusing data.

Additionally, as noted above, even in the case where the propagation time required for the congestion signal to reach the upstream end of the interconnect is considerable, the data signals transmitted from the first terminal during the congestion signal's latency are retained safely in the data line of the interconnect circuit and are not transmitted through the data line unnecessarily. Also, it is not necessary to prepare a high capacity data buffer at the downstream end of the interconnect circuit in order to store these additional data signals.

Also as noted above, both a congestion signal indicative of the second terminal's refusal to receive data and a congestion signal indicative of the second terminal's resumption of data reception may be transmitted at the same speed from the third terminal of the congestion line upstream toward the fourth terminal; in this case, when the second terminal resumes data reception, the time necessary for data signals to reach the second terminal immediately following this resumption of data reception is not a function of the latency of the entire interconnect. Also, data signals may be delivered to the second terminal at a rate equal to the rate with which they are transmitted from the first terminal; because data signals are temporarily stored in data driving circuits along the length of the interconnect, this data transfer rate may be achieved immediately upon resumption of data reception at the second terminal.

In another embodiment of the present invention, the speed with which the congestion signal indicative of a refusal to receive data is transmitted may be slower than the speed with which the congestion signal indicative of the second terminal's resumption of data reception is transmitted; the congestion signal effectuating interruption of data transmission, though slowed, may still propagate upstream fast enough such that two consecutive data signals input into the data line will not be entered into the same data driving circuit whose data transmission activity is temporarily suspended. In this embodiment, the number of data signals which can be stored temporarily in the data line of the interconnect circuit while the second terminal is refusing data reception can be increased, as illustrated in FIG. 7.

Returning to the example discussed above, consider an interconnect wire having a length of 10 mm. Assume that this long interconnect wire has typical values of a 0.1 μm-generation CMOS device (that is, wiring resistance R1=3,000 ohms, wiring capacity C1=2,000 fF, output resistance of the driving circuit that activates wire Rs=370 ohms, and output end's capacity C=28 fF). The latency of such a 10 mm long interconnect wire is about 3.8 ns. If the same wire were divided into 20 shorter data wires, however, and 20 data driving circuits as described above were inserted along the 10 mm length, the latency of the interconnect circuit becomes 1.2 ns.

An exemplary data input rate of the data signals entering a long interconnect may be, for example, 5 Gbps; again, this is a typical value for a 0.1 μm-generation CMOS device. In the case of a single long interconnect wire with the above-described parameters, the lag time for the second terminal to receive the first data signals after resumption of data reception is 1.2 ns. On the other hand, according to the present invention, the lag time for the second terminal to receive the first data signals after resumption of data reception is 200 ps at most, since that lag time will not exceed the data cycle of data signals. It will be appreciated that, in the amount of time required for the second terminal to receive the first data signal after resumption of data reception in a conventional long interconnect wire, an interconnect circuit in accordance with the present invention delivers six to seven data signals to the second terminal.

In order to maximize the number of data signals stored in compressed form in the interconnect circuit while data transmission is temporarily interrupted, it is necessary to reduce the speed with which the congestion signal to interrupt data transmission is transmitted through the secondary driving circuits of the congestion line; though slowed, the signal to interrupt data transmission may nevertheless propagate fast enough to ensure that two or more consecutive data signals in the data line are not input to the same data driving circuit whose data transmission activity is temporarily suspended. Such a condition may be fulfilled as follows.

Where the time required to transmit a data signal from the first terminal to the second terminal is Td, the time to transmit a congestion signal from the third terminal to the fourth terminal is Tb, the number of data driving circuits in the data line is n, the number of secondary driving circuits in the congestion line is m, and the minimum time required for entering a data signal into the first terminal of the interconnect circuit is Ts, then the value of Tb/m may be made as large as possible, so long as the value of Tb/m does not exceed the difference (Ts−Td/n).

Figure 10:
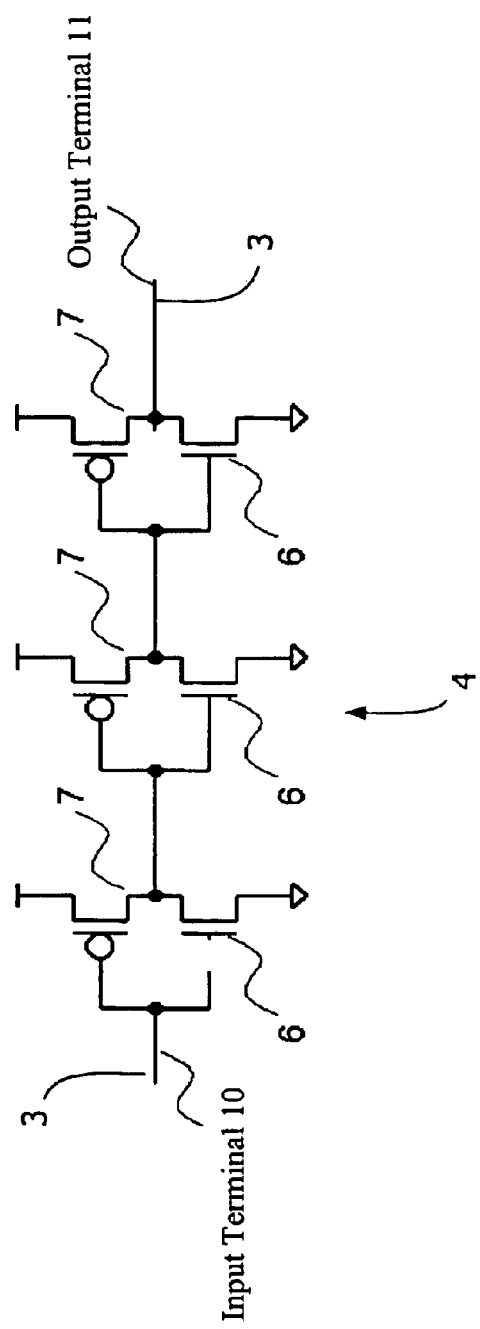
FIG. 10 is a schematic diagram of another embodiment of a secondary driving circuit for use in accordance with the present invention.

In order to increase the value of Tb as much as possible as described above, an additional embodiment of secondary driving circuit 4 may be implemented in an arrangement such as illustrated in FIG. 1. In this regard, FIG. 10 is a schematic diagram of another embodiment of secondary driving circuit 4 for use in accordance with the present invention. In the embodiment shown in FIG. 10, the CMOS inverter circuit between input terminal 10 and output terminal 11 is increased in size and complexity as compared to the embodiment in FIG. 4. As a result of this construction, the latency for congestion line 30 of FIG. 1 using the embodiment of secondary driving circuit 4 shown in FIG. 10 is increased accordingly.

Figure 11:
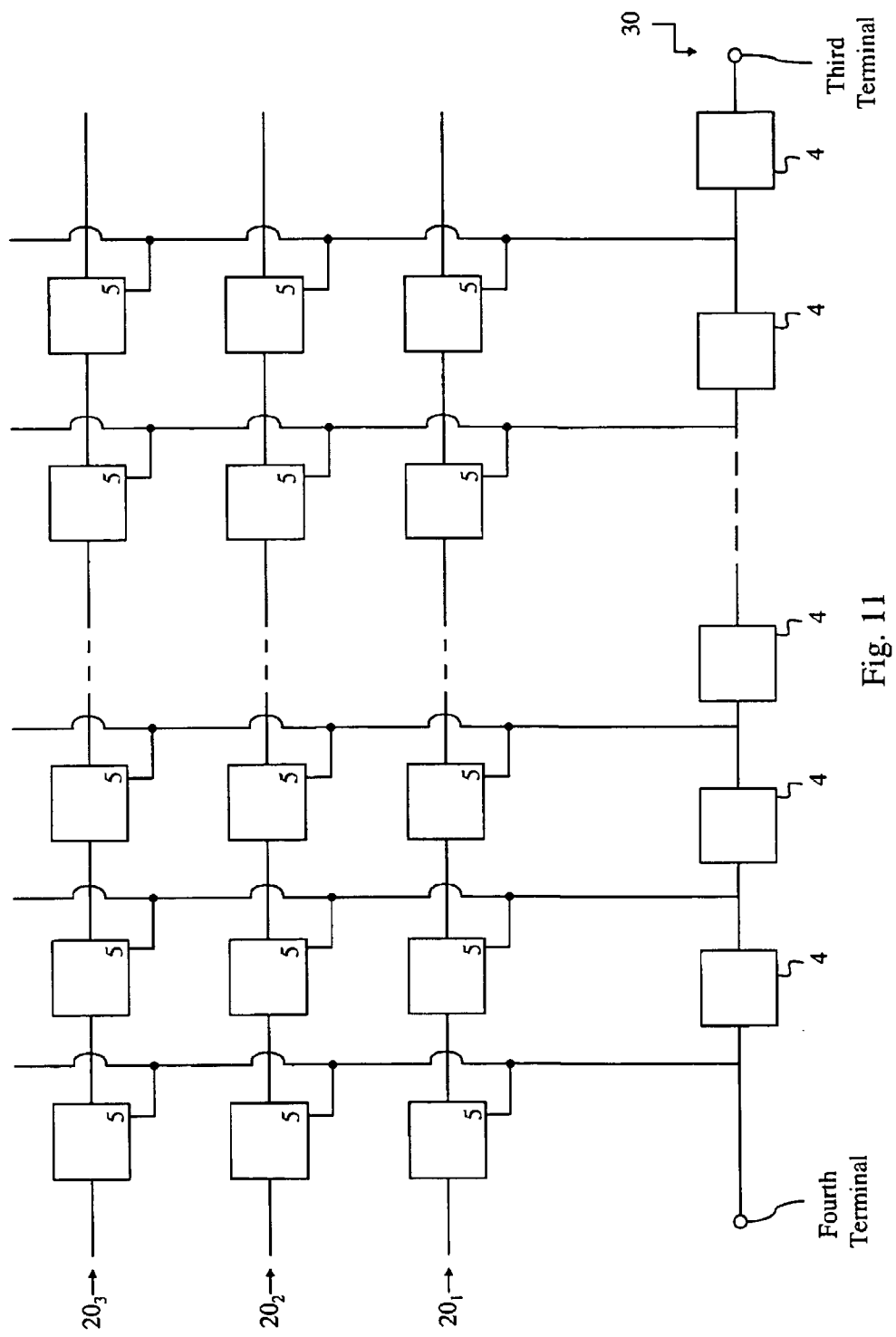
FIG. 11 is a schematic diagram of one embodiment of the interconnect circuit of the present invention employing a plurality of data lines arranged in parallel.

According to the foregoing description of the several embodiments of the present invention, data signals transmitted along the data line may be one bit long. In still another embodiment of the present invention, however, a plurality of data lines, each having a similar construction as data line 20 illustrated in FIG. 1, may be arranged in parallel. FIG. 11 illustrates, by way of example, one embodiment of such an interconnect circuit employing a plurality of parallel data lines $20_1$–$20_3$. Only three data lines $20_1$–$20_3$ are shown for clarity; it will be understood that more than three data lines may be desirable.

As shown in FIG. 11, the congestion input terminals 5 may be made common. By cascade-connecting a plurality of data lines such as $20_1$–$20_3$ in parallel, multi-bit signals may be transmitted in the same manner as described above, with each respective data line $20_1$–$20_3$ transmitting a respective bit of the multi-bit data signal. For example, where k parallel data lines are incorporated into an interconnect circuit, k-bit signals may be transmitted from the first terminal to the second terminal.

Further, in yet another embodiment, the data and secondary driving circuits which have heretofore been described and illustrated as merely amplifier circuits, may be changed to circuits with arithmetical or logical functions.

It will be appreciated by those of skill in the art that the interconnect circuit described herein enables maximum data throughput at all times, from the moment the second terminal of the interconnect resumes data reception; this data throughput is unimpeded by the latency of the long interconnection.

Additionally, the data driving circuits inserted in the data line along the length of the interconnect circuit may function as data buffers which may be capable of storing data signals temporarily. This is in contrast to conventional driving circuits which merely play a role in reducing the latency of a long wire and in increasing the maximum data throughput.

Further, when the second terminal of the long interconnect circuit refuses data reception, it is not necessary to discard the data signals which exist in the data line of the interconnect circuit of the present invention, nor is it necessary to discard the data signals which are input into the data line during the time the congestion signal travels the length of the congestion circuit.

From the foregoing, it can be seen that the interconnect circuit of the present invention provides maximum data throughput with minimum data loss and inefficiency. The preferred embodiments disclosed herein have been described and illustrated by way of example only, and not by way of limitation. Other modifications and variations to the invention will be apparent to those skilled in the art from the foregoing detailed disclosure. While only certain embodiments of the invention have been specifically described herein, it will be apparent that numerous modifications may be made thereto without departing from the spirit and scope of the invention.

What is claimed is:

1. In an integrated circuit, an interconnect circuit for transmitting data signals, said interconnect circuit comprising:
   a data line transmitting said data signals in said integrated circuit; and
   a congestion line transmitting congestion signals;
   wherein said data line comprises a plurality of data driving circuits which selectively interrupt and reestablish transmission of said data signals responsive to said congestion signals and wherein said plurality of data driving circuits store said data signals temporary when said transmission of said data signals is interrupted.

2. An interconnect circuit according to claim 1 wherein said data line transmits said data signals and said congestion line transmits said congestion signals in opposite directions.

3. An interconnect circuit according to claim 1 further comprising:
   a first terminal inputting said data signals into said data line; and
   a second terminal receiving said data signals from said data line;
   wherein said congestion signals are indicative of the status of said second terminal.

4. An interconnect circuit according to claim 3 wherein said congestion line transmits a congestion signal indicating that said second terminal cannot receive data at a slower speed than said congestion line transmits a congestion signal indicating that said second terminal can receive data.

5. An interconnect circuit according to claim 1 further comprising:
   one or more additional data lines transmitting additional data signals;
   wherein said one or more additional data lines comprise a plurality of data driving circuits which selectively interrupt and reestablish transmission of said data signals responsive to said congestion signals and wherein said plurality of data driving circuits store said data signals temporarily when said transmission of said data signals is interrupted.

6. An interconnect circuit according to claim 5 wherein said data line and said one or more additional data lines are arranged in parallel.

7. An interconnect circuit according to claim 1 wherein said plurality of data driving circuits are capable of arithmetical or logical functions.

8. An interconnect circuit according to claim 1 wherein in said data line further comprises:
   a first data driving circuit which interrupts transmission of said data signals responsive to a first congestion signal level and reestablishes transmission of said data signals responsive to a second congestion signal level; and
   a second data driving circuit which interrupts transmission of said data signals responsive to a third congestion signal level and reestablishes transmission of said data signals responsive to a fourth congestion signal level.

9. An interconnect circuit according to claim 8 wherein said data line further comprises:
   a plurality of first data driving circuits which interrupt transmission of said data signals responsive to said first congestion signal level and reestablish transmission of said data signals responsive to said second congestion signal level; and
   a plurality of second data driving circuits which interrupt transmission of said data signals responsive to said third congestion signal level and reestablish transmission of said data signals responsive to said fourth congestion signal level;
   wherein each of said plurality of first data driving circuits and each of said plurality of second data driving circuits are arranged in alternating fashion.

10. An interconnect circuit according to claim 8 wherein said congestion line supplies said first congestion signal level to said first data driving circuit and said third congestion signal level to said second data driving circuit.

11. An interconnect circuit according to claim 8 therein said congestion line supplies said second congestion signal level to said first data driving circuit and said fourth congestion signal level to said second data driving circuit.

12. An interconnect circuit according to claim 8 wherein said first congestion signal level is equal to said fourth congestion signal level and said second congestion signal level is equal to said third congestion signal level.

13. In an integrated circuit, an interconnect circuit comprising:
   a data line transmitting data signals from a first terminal to a second terminal in said integrated circuit; said data line comprising a plurality of data driving circuits selectively interrupting and reestablishing transmission of said data signals responsive to congestion signals; and
   a congestion line supplying said congestion signals to each of said plurality of data driving circuits.

14. An interconnect circuit according to claim 13 wherein said congestion line comprises a plurality of secondary driving circuits transmitting said congestion signals in said congestion line in a direction opposite the direction of said transmission of said data signals.

15. An interconnect circuit according to claim 13 wherein said congestion line supplies said congestion signals to each of said plurality of data driving circuits in sequence from said second terminal proceeding to said first terminal.

16. An interconnect circuit according to claim 13 wherein said congestion signals are indicative of the status of said second terminal and wherein:
   said plurality of data driving circuits interrupt transmission of said data signals responsive to a first congestion signal indicating said second terminal is not receiving data; and
   said plurality of data driving circuits reestablish transmission of said data signals responsive to a second congestion signal indicating said second terminal is receiving data.

17. An interconnect circuit according to claim 16 wherein said first congestion signal is transmitted through said congestion line at a slower speed than said second congestion signal.

18. An interconnect circuit according to claim 14 wherein the number of said secondary driving circuits is different from the number of said data driving circuits.

19. An interconnect circuit according to claim 13 further comprising:

a plurality of additional data lines transmitting additional data signals from said first terminal to said second terminal and selectively interrupting and reestablishing transmission of said additional data signals responsive to said congestion signals.

20. An interconnect circuit according to claim 19 wherein said data line and said plurality of additional data lines are arranged in parallel.

21. An interconnect circuit according to claim 13 wherein said data driving circuits are adapted to store said data signals temporarily during the period when said transmission of said data signals is interrupted.

22. An interconnect circuit according to claim 13 wherein said data driving circuits are capable of arithmetical or logical functions.

23. An interconnect circuit according to claim 13 wherein said congestion line supplies said congestion signals at a first congestion signal level and a second congestion signal level; said data line interrupting transmission of said data signals responsive to said first congestion signal level and reestablishing transmission of said data signals responsive to said second congestion signal level.

24. In an integrated circuit, a method of transmitting data signals through an interconnect, said method comprising:

providing a data line for transmitting said data signals from a first terminal to a second terminal in an integrated circuit through a plurality of data driving circuits;

providing a congestion line for transmitting congestion signals to each of said plurality of data driving circuits; and selectively interrupting and reestablishing transmission of said data signals at said plurality of data driving circuits responsive to said congestion signals.

25. A method according to claim 24 wherein said providing a congestion line further comprises providing a plurality of secondary driving circuits for transmitting said congestion signals in a direction opposite the direction of said transmission of said data signals.

26. A method according to claim 24 wherein said providing a data line further comprises enabling said plurality of data driving circuits to store said data signals temporarily when said transmission of said data signals is interrupted.

27. A method according to claim 24 wherein said transmitting congestion signals further comprises:

transmitting a first congestion signal indicating said second terminal is not receiving data; and alternatively, transmitting a second congestion signal indicating said second terminal is receiving data;

wherein said first congestion signal is transmitted at a slower speed than said second congestion signal.

28. A method according to claim 24 further comprising:

providing a plurality of additional data lines for transmitting additional data signals from said first terminal to said second terminal; and selectively interrupting and reestablishing transmission of said additional data signals responsive to said congestion signals.

29. A method according to claim 28 further comprising arranging said data line and said plurality of additional data lines in parallel.

30. A method according to claim 24 wherein said providing a data line includes providing said plurality of data driving circuits with arithmetical or logical function capabilities.

* * * * *